US008225927B2

(12) United States Patent
Narendrnath et al.

(10) Patent No.: US 8,225,927 B2
(45) Date of Patent: Jul. 24, 2012

(54) METHOD TO SUBSTANTIALLY ENHANCE SHELF LIFE OF HYGROSCOPIC COMPONENTS AND TO IMPROVE NANO-MANUFACTURING PROCESS TOOL AVAILABLITY

(75) Inventors: Kadthala R. Narendrnath, San Jose, CA (US); Ashish Bhatnagar, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/944,707

(22) Filed: Nov. 11, 2010

(65) Prior Publication Data

US 2011/0114519 A1    May 19, 2011

Related U.S. Application Data

(60) Provisional application No. 61/261,099, filed on Nov. 13, 2009.

(51) Int. Cl.
   *B65D 81/28* (2006.01)
(52) U.S. Cl. ..................... 206/213.1; 206/207
(58) Field of Classification Search ....... 206/204–213.1, 206/438–439, 524.8; 53/425, 432; 429/48, 429/185, 477
   See application file for complete search history.

(56) References Cited

U.S. PATENT DOCUMENTS

| | | | | |
|---|---|---|---|---|
| 2,814,382 | A * | 11/1957 | Lassiter | 53/431 |
| 3,728,839 | A * | 4/1973 | Glick | 206/210 |
| 3,815,315 | A * | 6/1974 | Glick | 206/524.8 |
| 5,482,771 | A | 1/1996 | Shah | |
| 5,529,856 | A * | 6/1996 | Petri et al. | 429/477 |
| 5,871,091 | A * | 2/1999 | Fogle | 206/205 |
| 6,040,085 | A * | 3/2000 | Cheu et al. | 429/185 |
| 6,076,662 | A * | 6/2000 | Bahten | 206/207 |
| 6,592,978 | B1 | 7/2003 | Miller et al. | |
| 7,299,603 | B2 * | 11/2007 | Horng et al. | 206/213.1 |
| 7,364,694 | B2 * | 4/2008 | Tornier | 53/425 |
| 7,364,815 | B2 * | 4/2008 | Nakagawa et al. | 429/48 |
| 7,594,577 | B2 * | 9/2009 | Iwatschenko | 206/524.8 |

FOREIGN PATENT DOCUMENTS

| | | |
|---|---|---|
| EP | 0237725 A1 | 9/1987 |
| WO | WO-00-76878 A1 | 12/2000 |

OTHER PUBLICATIONS

International Search Report and Written Opinion dated Jul. 28, 2011 for International Application No. PCT/US2010/056438.

* cited by examiner

*Primary Examiner* — Bryon Gehman
(74) *Attorney, Agent, or Firm* — Patterson & Sheridan, LLP

(57) ABSTRACT

A process has been developed that significantly reduces moisture absorption of components, resulting in a component which is less susceptible to moisture and adsorption/absorption effects to the components functionality. In one embodiment, a component having reduced susceptibility to moisture exposure includes a component disposed in an air-tight package, the component having a blocking gas disposed in pores on a surface of the component. In another embodiment, a method for preparing a component having reduced susceptibility to moisture exposure includes driving water from a component in a controlled environment, exposing the component in the controlled environment to a blocking gas, removing the component in the controlled environment, and optionally sealing the component in an air-tight package.

17 Claims, 8 Drawing Sheets

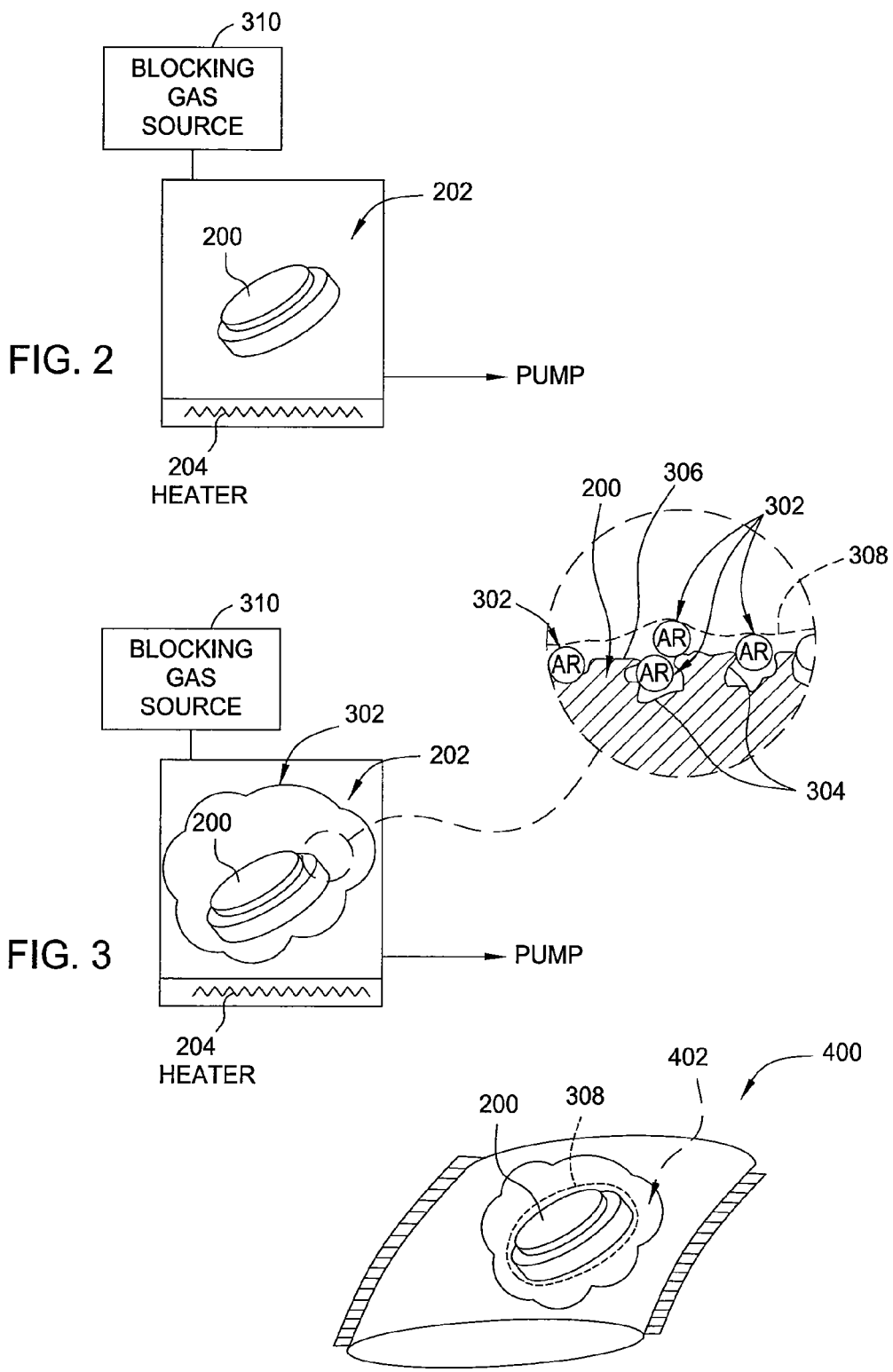

METHOD TO SUBSTANTIALLY ENHANCE SHELF LIFE OF HYGROSCOPIC COMPONENTS AND TO IMPROVE NANO-MANUFACTURING PROCESS TOOL AVAILABLITY

CROSS REFERENCE TO RELATED APPLICATIONS

This application claims benefit of U.S. Provisional Patent Application Ser. No. 61/261,099 filed Nov. 13, 2009, which is incorporated by reference in its entirety.

BACKGROUND OF THE INVENTION

1. Field of the Invention

Embodiments of the present invention generally relates to a component having enhanced shelf life and a method for enhancing the shelf life of a component. More particularly, embodiments of the present invention relate to a hygroscopic component having a gaseous blocking material present in the pores of the component, the gaseous blocking material having sufficient size or mass to inhibit the entry of water vapor into the pores, and a method for preparing the component with the gaseous blocking material.

2. Description of the Related Art

Some articles of manufacture are fabricated from, contain, or are coated with a hygroscopic material. If the article of manufacture is exposed to an ambient or other water vapor containing environment, the hygroscopic material will adsorb water, which in some instances, may cause degradation in performance, functionality and/or catastrophic failure of the article of manufacture or system in which the article is used.

For example, in many semiconductor processes which run at temperatures higher than ambient, the wafer substrate support (for example, an electrostatic chuck) is heated. When the substrate support is subsequently exposed to ambient atmosphere (for example, or during initial installation of the part in the chamber, venting at the end of the process run or during process chamber preventive maintenance) there is a tendency for moisture in the ambient atmosphere to be absorbed by the substrate support. This is especially the case where the substrate support has porosities (for example, when thermal/plasma spray processes are used to fabricate support substrates). The moisture must be removed from the substrate support prior to commencing the next run of substrate processing. This is typically done by heating the support substrate in the process chamber or vacuum ovens under normal or reduced pressures. This process takes several hours which can significantly affect the tool availability, customer productivity and cost of ownership.

In another example, heater insulating material, such as magnesium oxide is also hygroscopic. If the insulating material is exposed to an ambient environment, the water adsorbed by the insulating material may cause an electrical short within the heater. Unplanned down time for heater repair is particularly undesirable.

In most instances, it is virtually impossible to maintain an article of manufacture fabricated from, containing or coated with a hygroscopic material isolated from water vapor containing environments at all times between fabrication and ultimate use. Thus, such articles are always at risk for less than optimal performance or potential failure.

Therefore, there is a need for an improved article of manufacture (e.g., a component) which has less susceptibility to degradation when exposed to water vapor and a method for preparing an article of manufacture to have the same.

SUMMARY OF THE INVENTION

A process has been developed that significantly reduces moisture absorption of components, resulting in a component which is less susceptible to moisture and adsorption/absorption effects to the components functionality. This beneficially results in more robust components, better system performance and lower cost of ownership.

In one embodiment, a component having reduced susceptibility to moisture exposure includes a component disposed in a sealed air-tight package, the component having a blocking gas disposed in pores on a surface of the component.

In another embodiment, a method for preparing a component having reduced susceptibility to moisture exposure includes driving water from a component in a controlled environment, exposing the component in the controlled environment to a blocking gas, removing the component from the controlled environment, and optionally sealing the component in an air-tight package.

In yet another embodiment, a process for preserving the functionality of vacuum chamber components after a substrate has been removed from a processing chamber and before the processing chamber is vented, includes discharging a blocking gas into the process chamber at sub-ambient pressure so that chamber components therein that have hygroscopic materials are blanketed with the dry blocking gas. While the blocking gas speeds up the cooling of the chamber components, the blocking gas is also sucked into the porosities of the components and other locations of the components during cooling which would have otherwise provided adsorption and/or absorption sites for moisture. So, when the chamber is opened, and the chamber components are exposed to ambient atmosphere, the heavier blocking gas substantially prevents the moisture from getting adsorbed and/or absorbed into the surfaces of the chamber components.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2-4 depicts one embodiment of a sequence of a component being prepared in accordance to one embodiment of the process of FIG. 1;

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

A process has been developed that significantly reduces moisture absorption of components. In the case of substrate supports for semiconductor processing chambers, the process reduces and/or substantially eliminates the need for time consuming bake-outs in a process chamber prior to production. The process provides a component having high resistance to water intrusion, resulting in extended shelf life and less critical handling requirements. The process produces a component which is less susceptible to moisture and adsorption/absorption effects to the components functionality.

Figure 1:
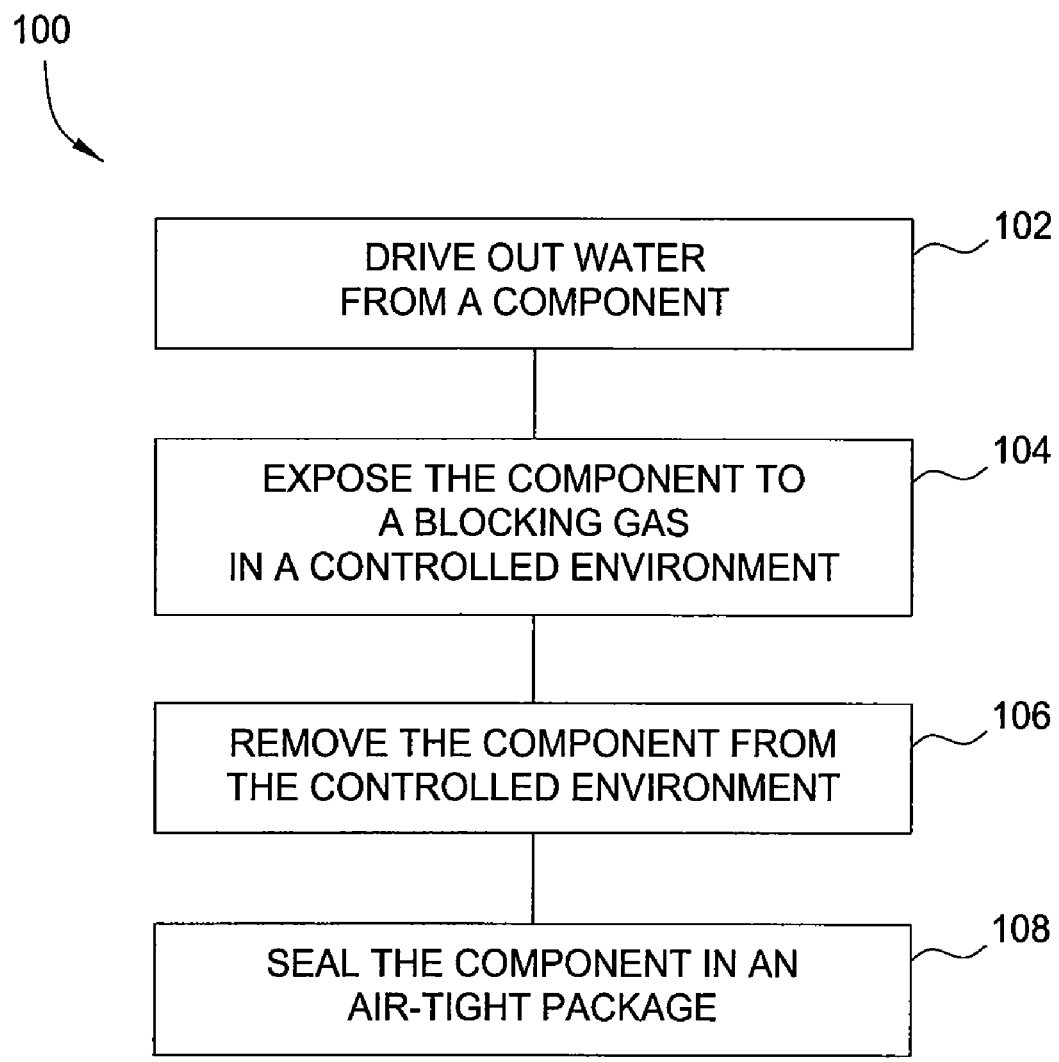
FIG. 1 depicts a flow diagram of an exemplary process for preparing an article of manufacture (e.g., a component) fabricated from or coated with a hygroscopic material for decrease susceptibility to water intrusion.

FIG. 1 depicts a flow diagram of an exemplary process 100 for preparing an article of manufacture (e.g., a component) fabricated from or coated with a hygroscopic material for decrease susceptibility to water intrusion. The component may be vacuum processing chamber component, high vacuum system component or other component having a porous surface. Other components which may benefit from the invention are medical components, orthopedic components, components having thermal/plasma sprayed coatings, prosthetic components; rechargeable battery/fuel cells having high surface area (i.e., highly porous surfaces), where moisture-adsorption/absorption affects functionality and shelf life of the component.

The process 100 begins at step 102 by driving out water (i.e., moisture) from the component. In one embodiment, the step 102 of driving out water may include at least one of heating and/or subjecting the component, or at least the portion of the component where it is advantageous to remove water therefrom, to vacuum conditions. In one embodiment, the step 102 of driving out water includes heating the component to at temperature of at least 30 degrees Celsius, such as to at least about 60 degrees Celsius or more. The step 102 may take place in a controlled environment, such as a vacuum chamber, an annealing chamber, a sintering chamber or other environment in which the temperature and/or gas composition surrounding the component may be controlled.

At step 104, the component, or at least the portion of the component where it is advantageous to remove water therefrom, is exposed while in the controlled environment to a blocking gas. The blocking gas is defined as a gas having a mass and/or size greater than that of a water vapor molecule. The blocking gas may be an element or compound. The blocking gas is non-reactive to the component. The blocking gas also does not adhere to the component beyond molecular or static attraction Examples of blocking gases include, but are not limited to, dry inert gas, dry argon, dry neon and dry nitrogen. The exposing step 104 is performed for a duration of time sufficient to allow the blocking gas to enter the pores of the component.

The exposing step 104 may be performed while the component is undergoing the step 102 of driving out the water from the component. Alternatively, the exposing step 104 may be performed while cooling the component after completion of all or part the driving step 102. Alternatively, the exposing step 104 may be performed while raising the pressure of the environment in which the component resides, during or after completion of part or all or part the driving step 102. Optionally, the exposing step 104 may be performed while both cooling the component after completion of all or part of the driving step 102 and while raising the pressure of the environment in which the component resides, during or after completion of part or all or part the driving step 102. Additionally, the pressure with the controlled environment may be cycled between pressure and vacuum to assist moisture removal and to drive the blocking gas into the pores.

At step 106, the component is removed from the controlled environment, if utilized, during step 104. After completion of step 104, the blocking gas occupies the interstitial pore spaces on the surface of the component, which would have otherwise provided adsorption and/or absorption sites for moisture. Thus, the presence of the heavier and/or larger blocking gas on or in the component substantially prevents moisture from being sucked back in to the component. Therefore, the blocking gas substantially prevents the moisture from getting adsorbed and/or absorbed. Although the blocking gas will not reside in the pores indefinitely, the resident time of the blocking gas in the component is significant, thus extending the shelf life (for example as measured by electrical properties) of the component by at least 10 times in some instances, as further evidenced by the example below.

At optional step 108, the component blanketed with the blocking gas at step 104 is sealed in an air-tight package. The air-tight package may be a polymer bag or container. In one embodiment, the air-tight package is a very low moisture permeability bag. The air-tight package may be vacuum sealed or back-filled with dry gas such as dry nitrogen. The back-filled gas may also be a blocking gas. Optionally, a desiccant may be sealed with the component in the air-tight package. Utilizing an air-tight package preserve the functional integrity of the component even in severely humid environments for a very long time without significant functional degradation of the component. Additionally, the blocking gas blanketing method can also be used to recover components whose functionality is affected by moisture absorption, and substantially improve their shelf life.

FIGS. 2-4 depicts one embodiment of a sequence of a component 200 being prepared in accordance to one embodiment of the process 100 described with reference to FIG. 1. Process 100 can also be used to recover components whose functionality is affected by moisture absorption, and substantially improve their shelf life and/or all reuse without further refurbishment. Referring first to FIG. 2, the component 200 is placed in a controlled environment 202 in which at least the temperature of the component 200 may be elevated to a temperature of at least 30 degrees Celsius, for example about 95 degrees Celsius by a heater 204. The temperature and duration that the component 200 is held at the elevated temperature is selected commensurate with the materials comprising the component 200, the amount of moisture needed to be removed from the component 200, among other parameters. For example, a ceramic electrostatic chuck (e.g., the component 200) suitable for use in a 300 mm semiconductor vacuum processing chamber may be held at about 65 degrees Celsius in HDP CVD chamber (e.g., the controlled environment 202) for a duration of about four hours. The pressure with the controlled environment 202 may also be maintained at sub-atmospheric pressure during heating.

Referring now to FIG. 3, a blocking gas 302 is introduced into the controlled environment 202 from a blocking gas source 310. The blocking gas 302 enters pores 304 defined in a surface 306 of the component 200 exposed to the blocking gas 302. The blocking gas 302 now occupies the space within the surface 306 of the component 200 which would have otherwise provided adsorption and/or absorption sites for moisture, thereby creating a non-adhered moisture barrier 308 on the surface 306 which substantially prevents the moisture from getting adsorbed and/or absorbed into the component and degradating the components moisture-content related functionality.

Referring now to FIG. 4, the component 200 having the moisture barrier 308 has been removed from the controlled environment 202 and placed inside a polymer bag 400. The polymer bag 400 is sealed as described above. Optionally, a dry inert gas 402 may back-fill the bag 400 to prevent moisture intrusion into the volume of the bag 400 where it may begin to replace the blocking gas over time.

Figure 5:
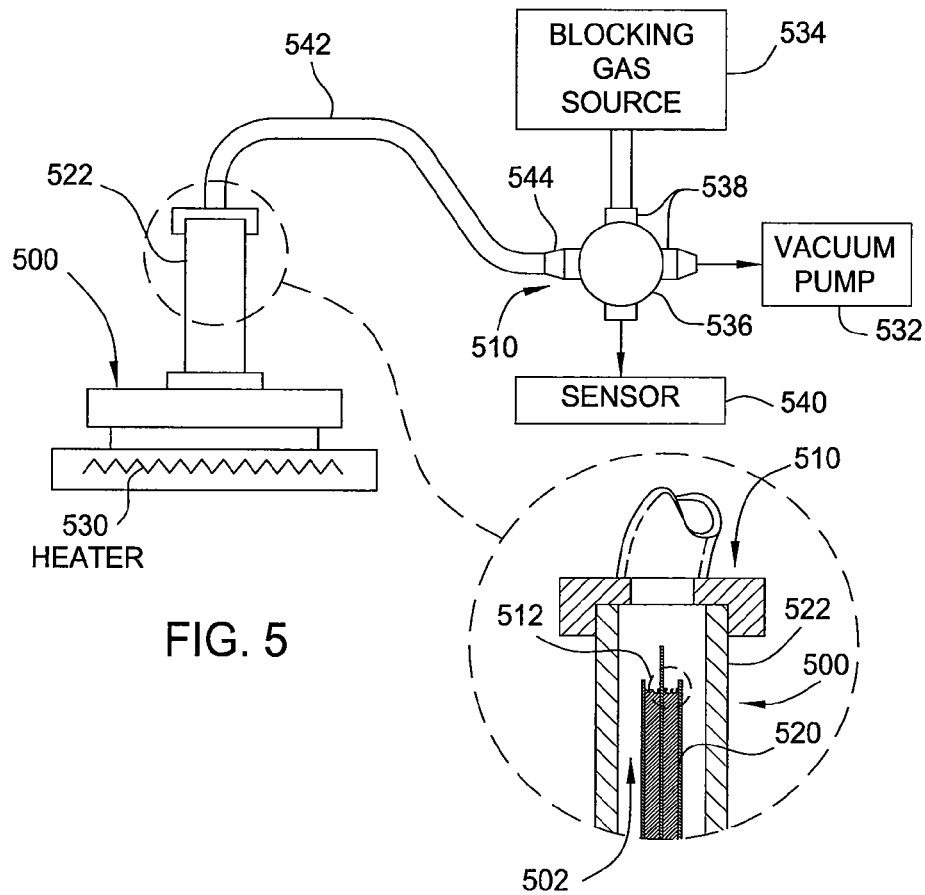
FIGS. 5-7 depicts another embodiment of a sequence of a component being prepared in accordance to one embodiment of the process of FIG. 1.
Figure 6:
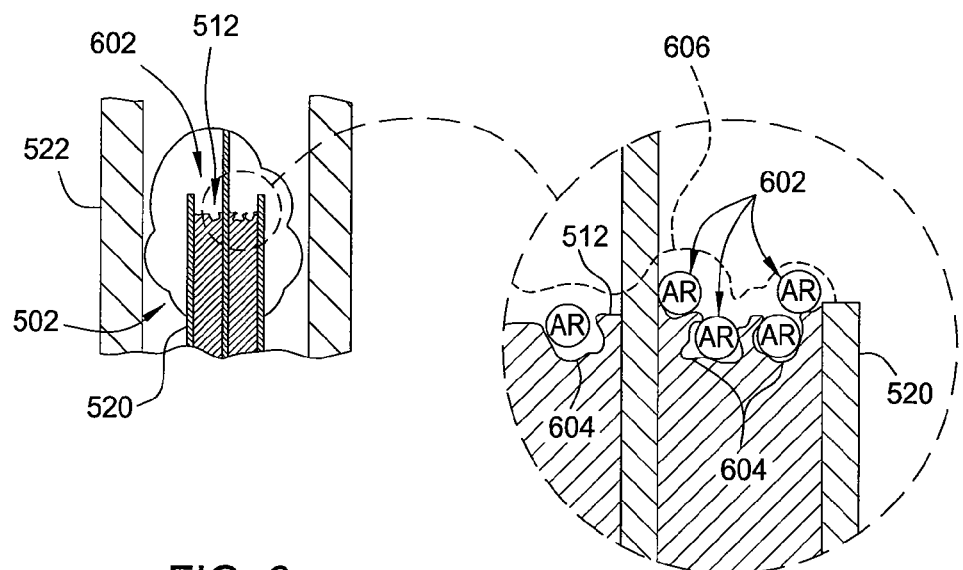
Figure 7:
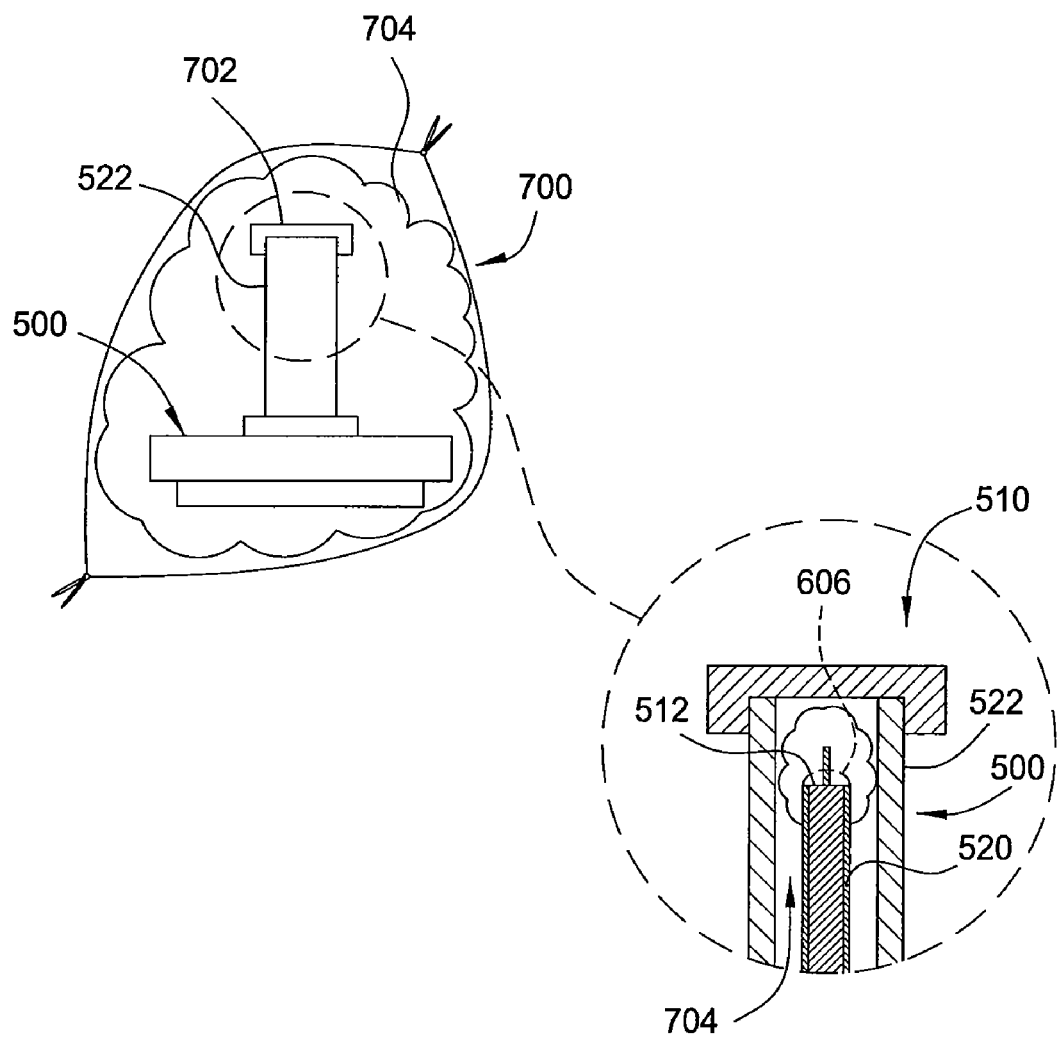

FIGS. 5-7 depicts another embodiment of a sequence of a component 500 being prepared in accordance to one embodiment of the process 100 described with reference to FIG. 1. Referring first to FIG. 5, the component 500 coupled to a fixture 510 such that a surface 512 of the component 500 which is to be exposed to a blocking gas is exposed to a controlled environment 502. In the embodiment depicted in FIG. 5, the component 500 is a heated substrate support pedestal having a hollow stem 522 which leads to a pedestal heating element 520. As the insulating material within the heating element is hydroscopic, the insulating material is the surface 512 in this example, as the fixture 510 sealingly couples to the stem 522 to define the controlled environment 502 within the hollow region of the stem 522 in which the heating element 520 resides. It is contemplated that one skilled in the art may readily adapt the invention to define different controlled environments for exposing other surfaces of the component to a blocking gas without need to place the component 500 in chamber, such as described with reference to FIGS. 2-4.

The component 500 is exposed to a heater 530 to elevate the surface 512 of the component to drive away moisture. The heater 530 may be a hot plate, radiant lamp or other heating device suitable for heating the component 500. During heating, a vacuum pump 532 coupled to the fixture 510 may evacuate the controlled environment 502.

Referring now to FIGS. 5 and 6, a blocking gas 602 is introduced into the controlled environment 502 from a blocking gas source 534 through the fixture 510. The blocking gas 602 enters pores 604 defined in a surface 512 of the component 500 exposed to the blocking gas 602. The blocking gas 602 now occupies the space within the surface 512 of the component 500 which would have otherwise provided adsorption and/or absorption sites for moisture, thereby creating a non-adhered moisture barrier 606 on the surface 512 which substantially prevents the moisture from getting adsorbed and/or absorbed into the component and degradating the components moisture-content related functionality. Optionally, the pressure with the controlled environment 502 coupled to the fixture 510 may be cycled between pressure and vacuum to assist moisture removal and to drive the blocking gas into the pores.

To allow for the controlled environment 502 to be exposed to both the blocking gas and vacuum, the fixture 510 includes one or more valves 538 configured to selectively couple the controlled environment 502 to the blocking gas source 534 and the vacuum pump 532. The one or more valves 538 of the fixture 510 may allow selective coupling of a sensor 540, such as a gas analyzer suitable for detecting moisture content of the gases exiting the fixture 510, so that a process end point may be more readily determined. In one embodiment, the one or more valves 538 may be butterfly valves and other suitable flow control devices. In the embodiment shown in FIG. 5, the fixture 510 includes a four-way cross 536 having butterfly valves 538 configured to selectively couple the vacuum pump 532, the blocking gas source 534, and the sensor 540 to the controlled environment 502 through a flexible hose 542. The fixture 510 further includes two conical reducers 544 sized to fluidly transition the four-way cross 536 to connected elements (e.g. the flexible hose 542 and a vacuum pump 532.)

Referring now to FIG. 7, the fixture 510 is removed from component 500 having the moisture barrier 606 now in place. The component 500 may be placed inside a polymer bag 700 and/or have another air-tight barrier (such as a cap 702 coupled to the end of stem 522). The polymer bag 700, when used, may be sealed as described above. Optionally, a dry inert gas 704 may back-fill the bag 700 and/or flood the hollow of the stem 522 sealed by the cap 702 to prevent moisture intrusion into the surface 512 of the component 500 where it may begin to replace the blocking gas over time.

In one example, utilizing the fixture 510, a component 500 (a DxZ heater available from Applied Materials, Inc., of Santa Clara, Calif., in this example) was treated using the process 100. The component 500 exhibited a substantial increase of approximately 9-10 times increased shelf life over the conventional processes (from about 6 hours to greater than 54 hours, as measured by change in resistance).

Figure 8:
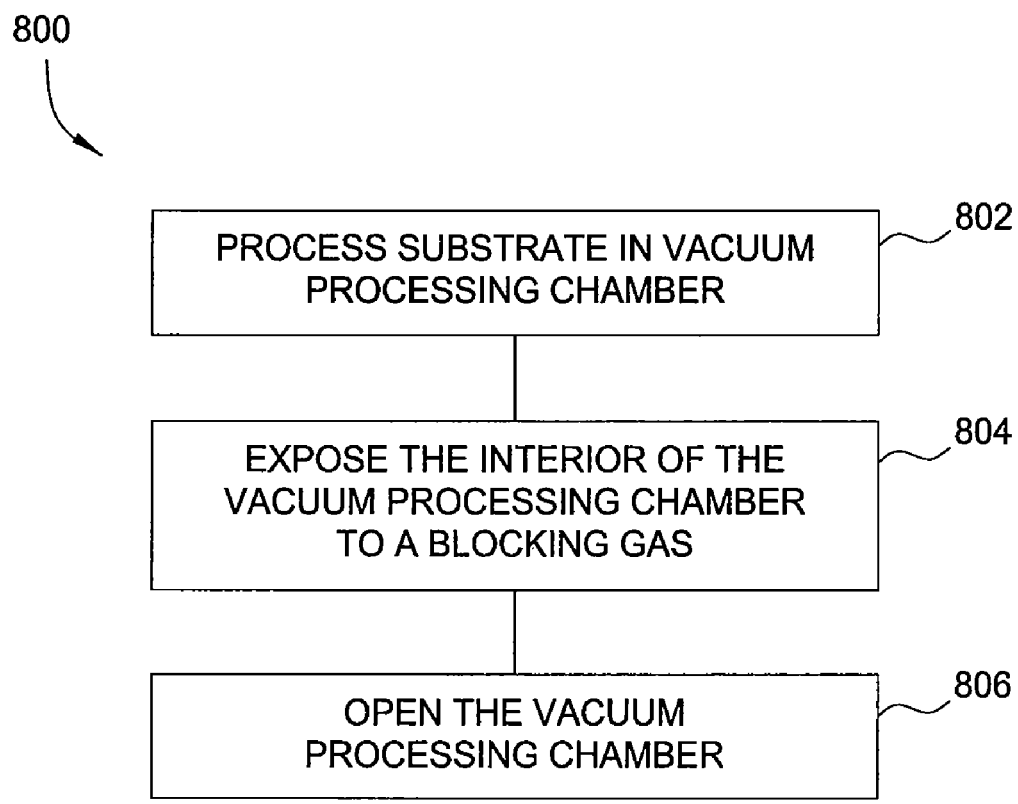
FIG. 8 depicts a flow diagram of an exemplary process for preparing a vacuum chamber component fabricated from or coated with a hygroscopic material for decrease susceptibility to water intrusion upon exposure to an ambient environment.
Figure 9:
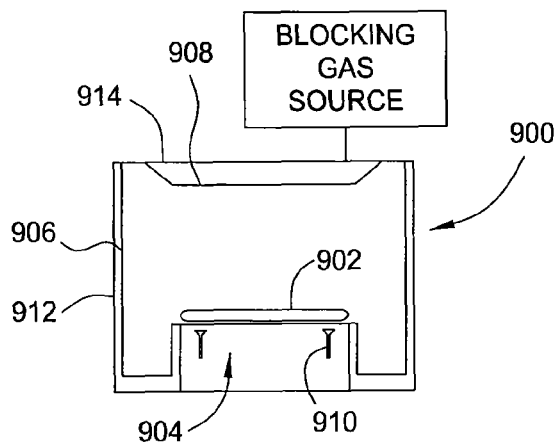
FIG. 9-11 depict simplified schematic diagrams of a processing chamber undergoing the process of FIG. 8.
Figure 10:
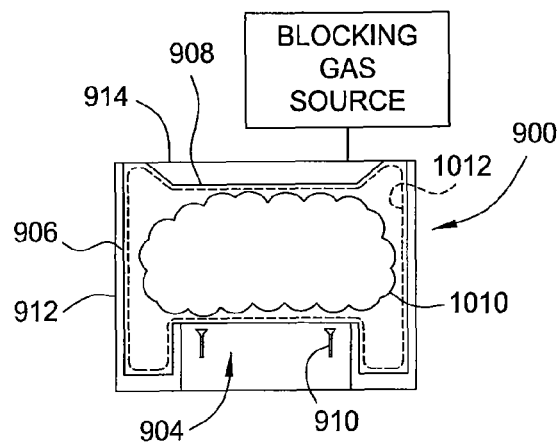
Figure 11:
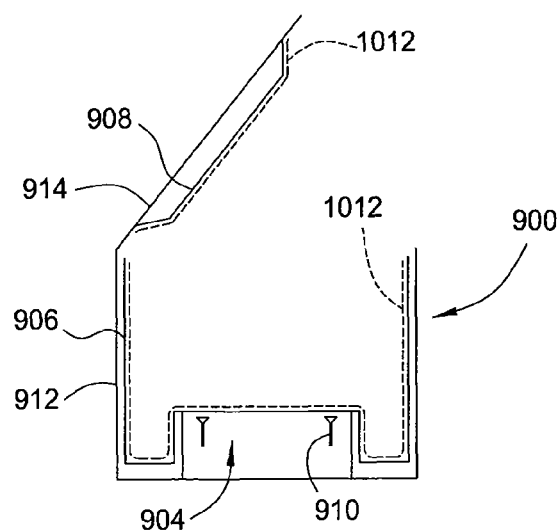

FIG. 8 depicts a flow diagram of an exemplary process for preparing a vacuum chamber component fabricated from or coated with a hygroscopic material for decrease susceptibility to water intrusion upon exposure to an ambient environment. FIG. 9-11 depict simplified schematic diagrams of a processing chamber undergoing the process of FIG. 8. The reader is encouraged to refer to FIGS. 8-11 simultaneously.

In the embodiment of FIGS. 8-11, the invention may be applied to a process 800 for preserving the functionality of vacuum chamber components which having been in use, and are subsequently exposed to atmospheric conditions where moisture exposure may be detrimental to the functionality of the chamber components. In one embodiment, a semiconductor vacuum processing chamber 900 is utilized to process a substrate 902 at step 802. The vacuum processing chamber 900 may be an etch chamber, a chemical vapor deposition chamber, a physical vapor deposition chamber, an ion implant chamber, an annealing chamber, a plasma treatment chamber or other suitable vacuum processing chamber. After the substrate 902 is removed from the chamber 900 and before the chamber is vented, a blocking gas 1010, for example, a dry inert gas, dry nitrogen and dry Argon, is discharged into the process chamber 900 at sub-ambient pressure so that chamber components therein, such as a support substrate 904, chamber liner 906, showerhead 908, lift pins 910, chamber walls 912, lid 914 and other components that have hygroscopic materials, are blanketed with the dry blocking gas 1010 at step 804. While the blocking gas 1010 speeds up the cooling of the chamber components, the blocking gas 1010 is also sucked into the porosities of the components and other locations of the components during cooling which would have otherwise provided adsorption and/or absorption sites for moisture. The blocking gas 1010 may also be supplied during venting. Thus, when the chamber 900 is opened at step 806, as illustrated in FIG. 11, and the chamber components are exposed to ambient atmosphere, a barrier layer 1012 of heavier blocking gas 1010 left on the chamber components substantially prevents the moisture from getting adsorbed and/or absorbed into the surfaces of the chamber components.

For example, tests on multiple substrate support samples (i.e., chamber components) have demonstrated the shelf life of a HDPCVD plasma-sprayed electrostatic chuck to improve significantly from less than 60 minutes (via current process) to more than 3 days (greater than a 70 times improvement) even when exposed to substantially higher (twice as much) humidity—this provides more than sufficient life to these components during venting and/or preventive maintenance of the process chamber. The storage shelf life of the components is also substantially increased.

The blocking gas 1010 can also be used as a pre-venting process in chambers where chamber walls 912 have been anodized or coated with resultant porous surface. The blocking gas is absorbed/adsorbed into the chamber walls 912 and significantly minimizes moisture adsorption/absorption, thus, substantially reducing chamber recovery time due to diminished chamber bakeout requirements.

This blocking gas 1010 blanketing during bake-out and subsequent cooling of the components can be used to increase shelf life for other components as well (for example, side-coils, heating elements, heaters, etc.) that have hygroscopic materials (for example, magnesium oxide, etc.) serving as electrical insulation, packing media, and such.

Figure 12:
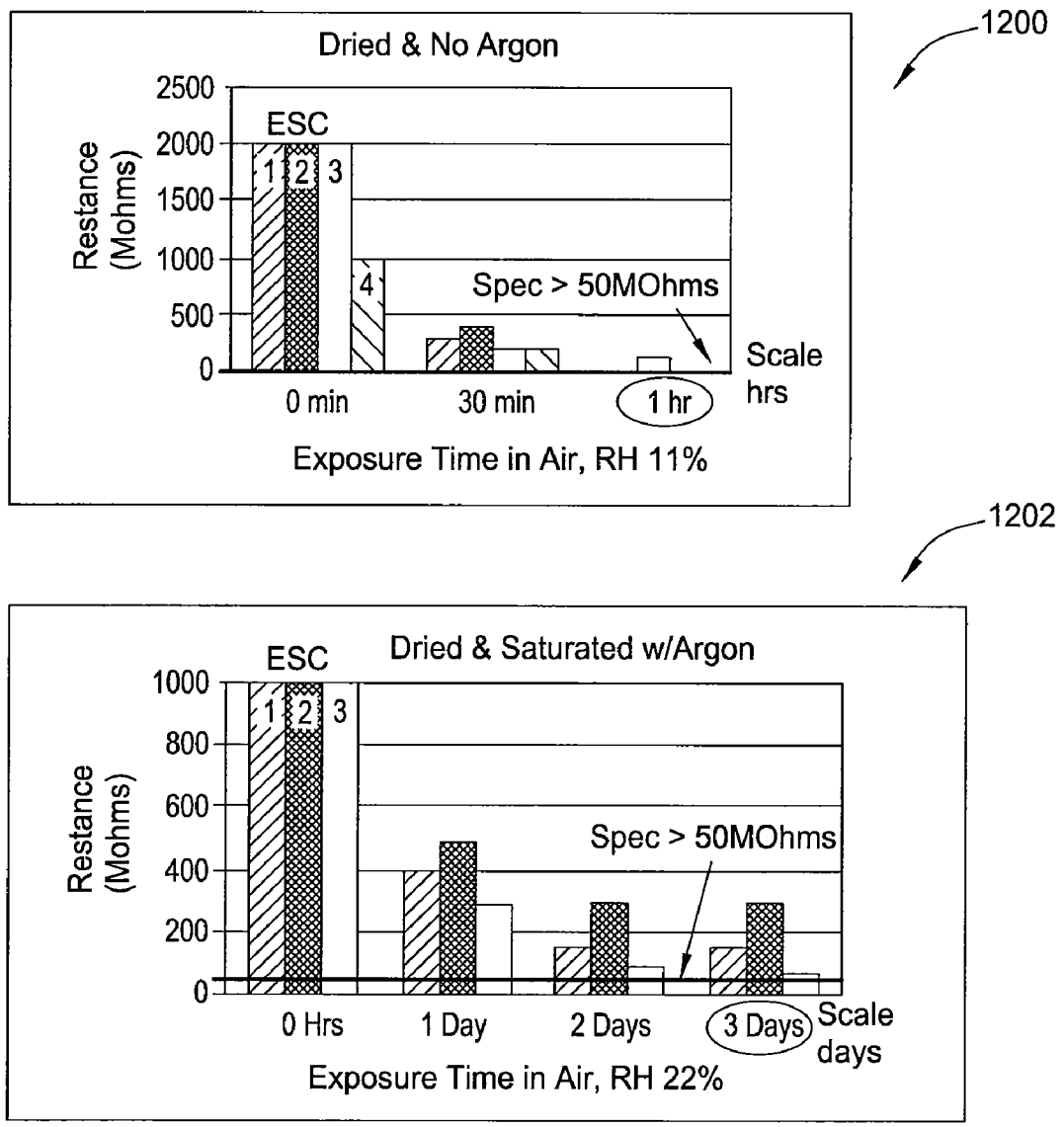
FIGS. 12-13 include graphs illustrating a comparison of results between treating components using the inventive and conventional methods.

FIG. 12 illustrates, as charts 1200 and 1202, results of experiments conducted on a representative component (an electrostatic chuck (ESC) in this example) to demonstrate significant improvement in shelf life. The chart 1200 illustrates a baseline generated from conventional practices. The chart 1200 shows that with existing processes, wherein processing chamber components are dried without utilizing blocking gases as described above, the electrical resistance of the ESC drops from 2000 MOhms to below spec (50 MOhms) in less than 1 hour when exposed to atmosphere even with a relatively low Relative Humidity of 11%. This results in a very low shelf life, and can lead to product performance issues and potential failures (not meeting specs, arcing, electrical shorting). Specification-related issue is addressed by several hours of in-chamber baking prior to substrate processing leading to lower chamber availability and lower overall productivity. This is very expensive in a semiconductor fab with multiple tools and chambers.

Chart 1202 illustrated an example of improvements achieved by utilizing aspects of the present invention. For example, when blocking gas (for example, dry Argon) blanket is used as last part of the substrate processing run or is used during bake-out of the component during its manufacturing process, an improvement of 70 times the resistivity level and shelf life of the ESC has been realized. Chart 1202 shows that the component electrical properties are above specs (greater than 50 MOhms) after 3 days even when exposed to atmosphere having twice as much relative humidity than utilized in the baseline sample seen in Chart 1200.

Figure 13:
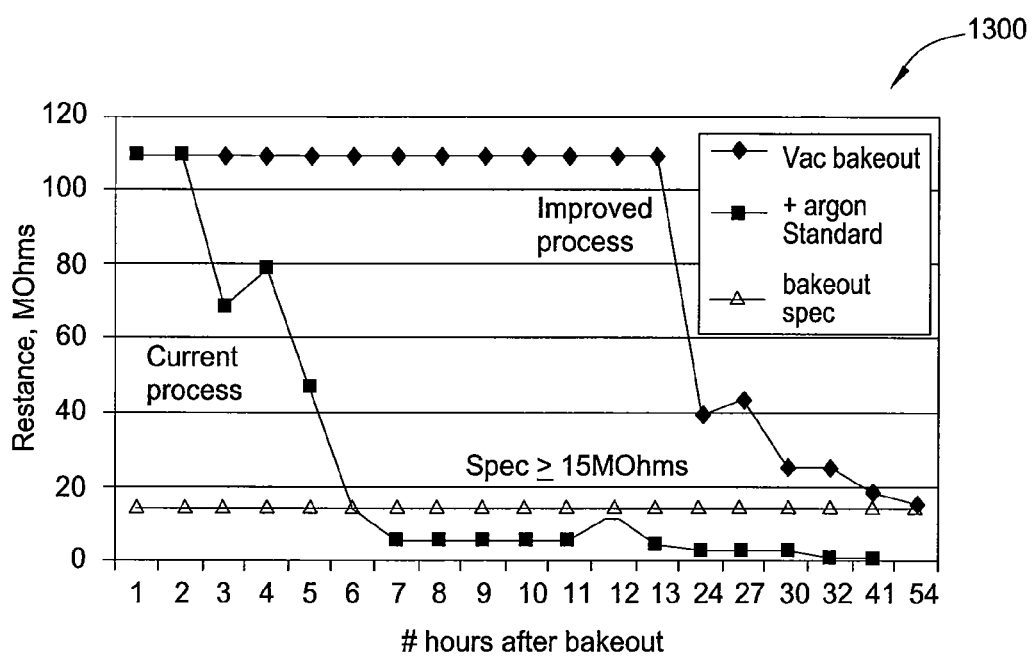

FIG. 13 is a chart 1300 further comparing the results of experiments demonstrating the resistance of a component such as component 500 of FIG. 5 when being prepared according to existing processes versus according to aspects of the present invention. The chart 1300 shows that using existing processes, the electrical resistance of a component drops from approximately 110 MOhms to below spec resistance of 15 MOhms in less than 7 hours after a vacuum bakeout. In contrast, chart 1300 shows that, when utilizing processing described herein, the resistance of the component maintains at approximately 110 MOhms for at least 12 hours after a vacuum bakeout using a blocking gas (e.g. argon), before dropping to the specification value of about 15 MOhms at around the 54-hour mark.

Thus, the present invention provides a chamber component which is less susceptible to moisture and adsorption/absorption effects to the components functionality. The chamber component of the present invention has increase shelf life and improved functionality, advantageously improving performance and reducing lost tool capacity due to extended maintenance down time, thereby enhancing productivity and process throughput.

While the foregoing is directed to embodiments of the present invention, other and further embodiments of the invention may be devised without departing from the basic scope thereof, and the scope thereof is determined by the claims that follow.

What is claimed:

1. A component having a porous surface, the surface having reduced susceptibility to moisture exposure, comprising:
    a component having a non-adhered moisture barrier disposed on the porous surface of the component, wherein the non-adhered moisture barrier comprises a blocking gas disposed in pores on surface of the component, wherein the component is selected from the group consisting of a medical component, an orthopedic component, a prosthetic component, a rechargeable battery cell having high surface area, and a fuel cell having high surface area; and
    a sealed air-tight package having the component disposed therein, wherein the blocking gas is selected relative to a size of the pores on the surface to form the non-adhered moisture barrier such that the blocking gas remains in the pores on the surface after the sealed air-tight package is opened.

2. The component of claim 1, wherein the sealed air-tight package is vacuum sealed.

3. The component of claim 1, wherein the sealed air-tight package is back-filled with a dry inert gas.

4. The component of claim 3, wherein the dry inert gas is selected from the group consisting of argon, neon and nitrogen.

5. The component of claim 3, wherein the dry inert gas has at least one of a mass and size greater than that of a water vapor molecule.

6. The component of claim 1, wherein the component is fabricated from or coated with a hygroscopic material.

7. A component having reduced susceptibility to moisture exposure, comprising:
    a processing chamber component having a non-adhered moisture barrier disposed on a porous surface of the processing chamber component, wherein the non-adhered moisture barrier comprises a blocking gas disposed in pores on the surface of the processing chamber component, wherein the processing chamber component is selected from the group consisting of a vacuum processing chamber component, a high vacuum system component, a component having thermal sprayed coating, a component having plasma sprayed coating; and
    a sealed air-tight package having the component disposed therein, wherein the blocking gas is selected relative to a size of the pores on the surface to form the non-adhered moisture barrier such that the blocking gas remains in the pores on the surface after the sealed air-tight package is opened.

8. The chamber component of claim 7, wherein the sealed air-tight package is vacuum sealed.

9. The chamber component of claim 7, wherein the sealed air-tight package is back-filled with a dry inert gas.

10. The chamber component of claim 9, wherein the dry inert gas is selected from the group consisting of argon, neon and nitrogen.

11. The chamber component of claim 9, wherein the dry inert gas has at least one of a mass and size greater than that of a water vapor molecule.

12. The chamber component of claim 9, wherein the component is an electrostatic chuck.

13. A component having a porous surface, the surface having a reduced susceptibility to moisture exposure, comprising:
   a component having a non-adhered moisture barrier disposed on the porous surface of the component, wherein the non-adhered moisture barrier comprises a blocking gas disposed in pores on a surface of the component, wherein the component is a rechargeable battery cell having high surface area or a fuel cell having high surface area; and
   a sealed air-tight package having the component disposed therein, wherein the blocking gas is selected relative to a size of the pores on the surface to form the non-adhered moisture barrier such that the blocking gas remains in the pores on the surface after the sealed air-tight package is opened.

14. The component of claim 13, wherein the sealed air-tight package is vacuum sealed.

15. The component of claim 13, wherein the sealed air-tight package is back-filled with a dry inert gas.

16. The component of claim 15, wherein the dry inert gas is selected from the group consisting of argon, neon and nitrogen.

17. The component of claim 15, wherein the dry inert gas has at least one of a mass and size greater than that of a water vapor molecule.

* * * * *